(12) United States Patent
Katkar

(10) Patent No.: US 10,269,853 B2
(45) Date of Patent: Apr. 23, 2019

(54) IMAGE SENSOR DEVICE

(71) Applicant: Invensas Corporation, San Jose, CA (US)

(72) Inventor: Rajesh Katkar, Milpitas, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/875,067

(22) Filed: Jan. 19, 2018

(65) Prior Publication Data

US 2018/0145105 A1    May 24, 2018

Related U.S. Application Data

(62) Division of application No. 14/945,292, filed on Nov. 18, 2015, now Pat. No. 9,899,442.

(Continued)

(51) Int. Cl.
| | |
|---|---|
| *H01L 23/00* | (2006.01) |
| *H01L 23/48* | (2006.01) |
| *H01L 21/768* | (2006.01) |
| *H01L 27/146* | (2006.01) |

(52) U.S. Cl.
CPC .. *H01L 27/14634* (2013.01); *H01L 21/76898* (2013.01); *H01L 23/481* (2013.01);
(Continued)

(58) Field of Classification Search
CPC ......... H01L 27/14634; H01L 27/14618; H01L 27/14636; H01L 27/1464; H01L 27/14687;
(Continued)

(56) References Cited

U.S. PATENT DOCUMENTS 5,051,802 A * 9/1991 Prost ................. H01L 27/14618
257/434
7,663,231 B2    2/2010 Chang et al.
(Continued)

FOREIGN PATENT DOCUMENTS

| EP | 1011133 A1 | 6/2000 |
|---|---|---|
| JP | 2008130603 A | 6/2008 |
| WO | 2008112101 A2 | 9/2008 |

OTHER PUBLICATIONS

International Search Report and Written Opinion for PCT Application No. PCT/US2015/063239, dated Feb. 23, 2016, Applicant: Invensas Corporation, 16 pages.

*Primary Examiner* — Mark W Tornow

(57) ABSTRACT

An image sensor device, as well as methods therefor, is disclosed. This image sensor device includes a substrate having bond pads. The substrate has a through substrate channel defined therein extending between a front side surface and a back side surface thereof. The front side surface is associated with an optically-activatable surface. The bond pads are located at or proximal to the front side surface aligned for access via the through substrate channel. Wire bond wires are bonded to the bond pads at first ends thereof extending away from the bond pads with second ends of the wire bond wires located outside of an opening of the channel at the back side surface. A molding layer is disposed along the back side surface and in the through substrate channel. A redistribution layer is in contact with the molding layer and interconnected to the second ends of the wire bond wires.

10 Claims, 12 Drawing Sheets

Related U.S. Application Data

(60) Provisional application No. 62/090,788, filed on Dec. 11, 2014.

(52) U.S. Cl.
CPC .......... *H01L 24/18* (2013.01); *H01L 27/1464* (2013.01); *H01L 27/1469* (2013.01); *H01L 27/14618* (2013.01); *H01L 27/14636* (2013.01); *H01L 27/14687* (2013.01); *H01L 2224/04105* (2013.01); *H01L 2224/12105* (2013.01); *H01L 2224/18* (2013.01); *H01L 2224/19* (2013.01); *H01L 2224/32145* (2013.01); *H01L 2224/73267* (2013.01); *H01L 2924/15153* (2013.01); *H01L 2924/16235* (2013.01)

(58) Field of Classification Search
CPC ..... H01L 27/1469; H01L 24/19; H01L 24/24; H01L 24/97; H01L 25/0657; H01L 25/16
See application file for complete search history.

(56) References Cited

U.S. PATENT DOCUMENTS

| | | |
|---|---|---|
| 7,759,751 B2 | 7/2010 | Ono |
| 8,168,458 B2 | 5/2012 | Do et al. |
| 8,193,632 B2 * | 6/2012 | Chang ............... H01L 21/76898 |
| | | 257/698 |
| 8,263,434 B2 | 9/2012 | Pagaila et al. |
| 8,618,659 B2 | 12/2013 | Sato et al. |
| 8,791,575 B2 | 7/2014 | Oganesian et al. |
| 8,878,353 B2 | 11/2014 | Haba et al. |
| 9,136,293 B2 | 9/2015 | Yee et al. |
| 9,252,172 B2 | 2/2016 | Chow et al. |
| 9,476,898 B2 * | 10/2016 | Takano .................... H01L 29/84 |
| 2008/0308928 A1 * | 12/2008 | Chang ................. H01L 25/0657 |
| | | 257/723 |
| 2010/0167534 A1 | 7/2010 | Iwata |
| 2012/0194719 A1 * | 8/2012 | Churchwell ........ H01L 23/5389 |
| | | 348/302 |

* cited by examiner

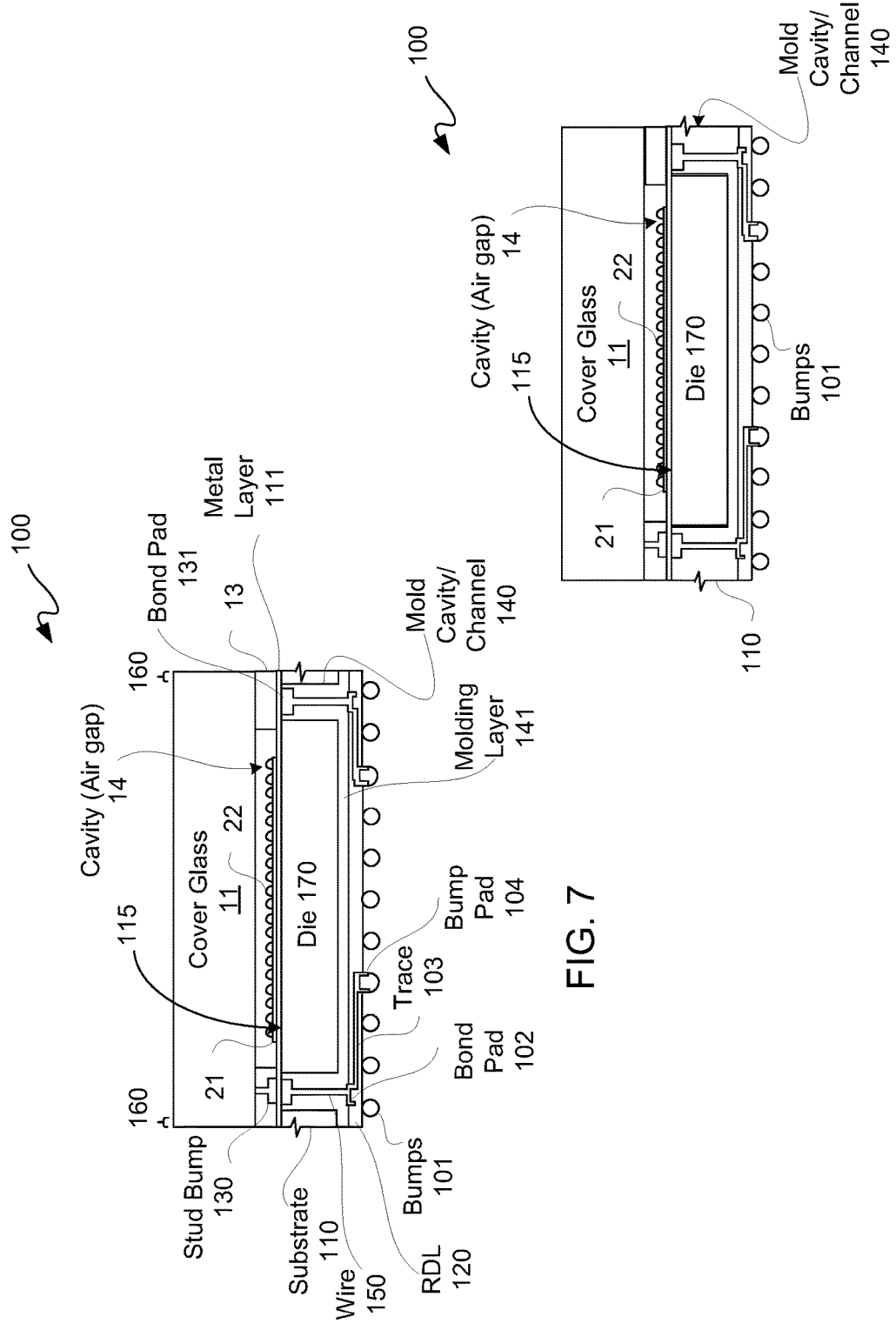

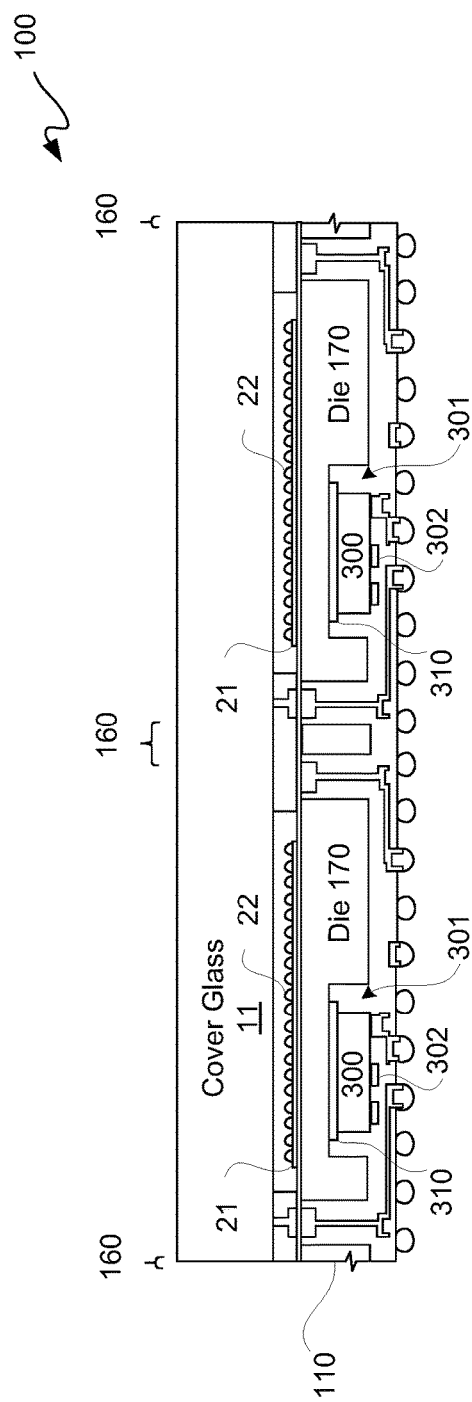
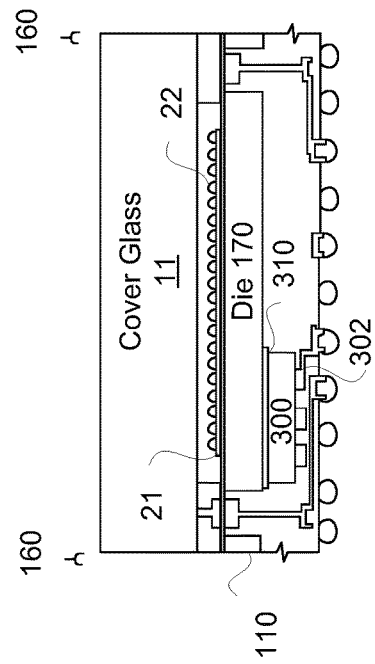
FIG. 10
FIG. 11

IMAGE SENSOR DEVICE

CROSS-REFERENCE TO RELATED APPLICATION(S)

This application is a divisional of and hereby claims priority to U.S. patent application Ser. No. 14/945,292, filed Nov. 18, 2015, which claims priority to U.S. Provisional Application No. US 62/090,788, filed Dec. 11, 2014, the entirety of each of which is hereby incorporated by reference herein for all purposes.

FIELD

The following description relates to integrated circuits ("ICs"). More particularly, the following description relates to an image sensor device.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements, such as passive devices including inductors, capacitors and resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, a die stacking configuration, or a more convenient or accessible position of bond pads for example.

Conventionally, an image sensor device, such as for a digital camera, is coupled to a separate controller chip ("controller"), such as to control sensor sensing time (exposure time), thresholds, and/or other features. An image sensor device may further be coupled to a separate driver chip and a separate image processor chip, as is known. Such controller may further be coupled to a motor for adjusting focus and/or electronic aperture, among other camera components. Distance between an image sensor device and a separate chip coupled thereto, such as a controller or image sensor for example, of a camera causes an amount of signal propagation delay. This delay can negatively impact performance of a camera.

Accordingly, it would be desirable and useful to provide a camera with less propagation time between an image sensor device and a separate chip coupled thereto.

BRIEF SUMMARY

An apparatus relates generally to an image sensor device. In such an image sensor device, there is a substrate having bond pads. The substrate has a front side surface and a back side surface opposite the front side surface. The front side surface is associated with an optically-activatable surface. The substrate has a through substrate channel defined therein extending between the front side surface and the back side surface. The bond pads are located at or proximal to the front side surface of the substrate aligned for access via the through substrate channel. Wire bond wires are bonded to the bond pads at first ends thereof extending away from the bond pads with second ends of the wire bond wires located outside of an opening of the channel at the back side surface of the substrate. A molding layer is disposed along the back side surface of the substrate and in the through substrate channel. A redistribution layer is in contact with the molding layer and interconnected to the second ends of the wire bond wires.

A method relates generally to forming an image sensor device. In such a method, a substrate having an image sensor die is obtained. A conductive layer is plated on a front side surface of the substrate. A through channel is formed in the substrate from a back side surface to the front side surface of the substrate. Wire bond wires are bonded to conductive pads located in the channel. The wire bond wires extend in the channel away from the pads with tips of the wire bond wires located outside of the channel. A molding layer is deposited onto the back side surface of the substrate including into the channel. A redistribution layer is coupled to the wire bond wires for electrical conductivity.

A method relates generally to forming an image sensor device. In such a method, a substrate having an image sensor die is obtained. A conductive layer is deposited on a front side surface of the substrate. A through channel is formed in the substrate from a back side surface to the front side surface of the substrate. An image controller die or an image processor die having interconnects is coupled to the back side surface of the substrate. Wire bond wires are bonded to conductive pads located in the channel. The wire bond wires extend in the channel away from the pads, and tips of the wire bond wires are located outside of the channel and above or at least even with interconnects of the image controller die or the image processor die. A molding layer is deposited onto the back side surface of the substrate including into the channel. A redistribution layer is coupled to the wire bond wires and the interconnects for electrical conductivity.

Another apparatus relates generally to an image sensor device. In such an image sensor device, there is an image sensor, and a substrate is coupled to the image sensor. The substrate has a front side surface and a back side surface opposite the front side surface. The substrate has a through substrate channel defined therein at least extending between the front side surface and the back side surface. The bond pads are located at or proximal to the front side surface of the substrate aligned for access via the through substrate channel. Wire bond wires are bonded to the bond pads at first ends thereof extending away from the bond pads with second ends of the wire bond wires located outside of an opening of the channel at the back side surface of the substrate. A molding layer is disposed along the back side surface of the substrate and in the through substrate channel. A redistribution layer is in contact with the molding layer and interconnected to the second ends of the wire bond wires.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 7 is a cross-sectional side view illustratively depicting an exemplary image sensor device with dicing lanes for sensor dies in a substrate.

FIG. 8 is a cross-sectional side view illustratively depicting an exemplary image sensor device with dicing lanes in mold cavities.

FIG. 10 is a cross-sectional side view illustratively depicting an exemplary image sensor device with dicing lanes for an image sensor die in a substrate and with an optional embedded die.

FIG. 11 is a cross-sectional side view illustratively depicting another exemplary image sensor device with dicing lanes for an image sensor die in a substrate and with an optional embedded die.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Figure 1:
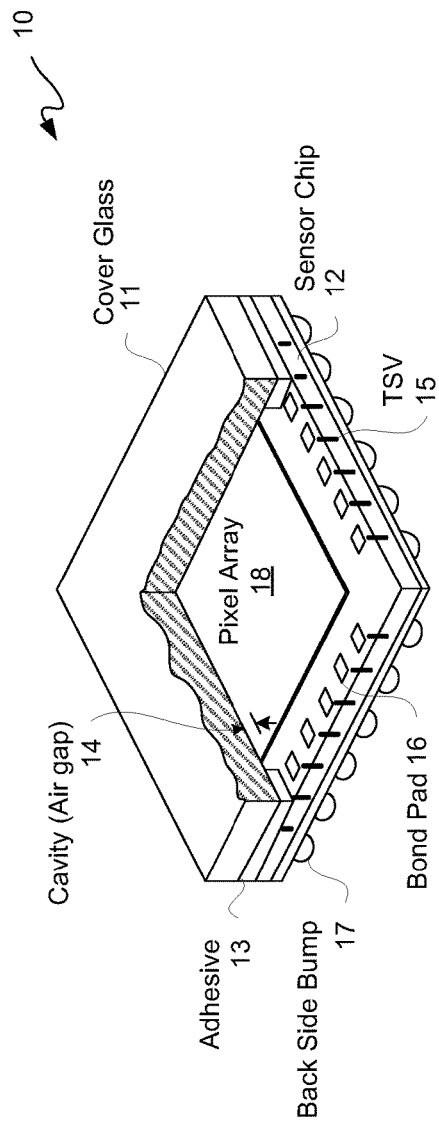
FIG. 1 is a top-down perspective and cut-away view illustratively depicting an exemplary conventional image sensor device.
Figure 2:
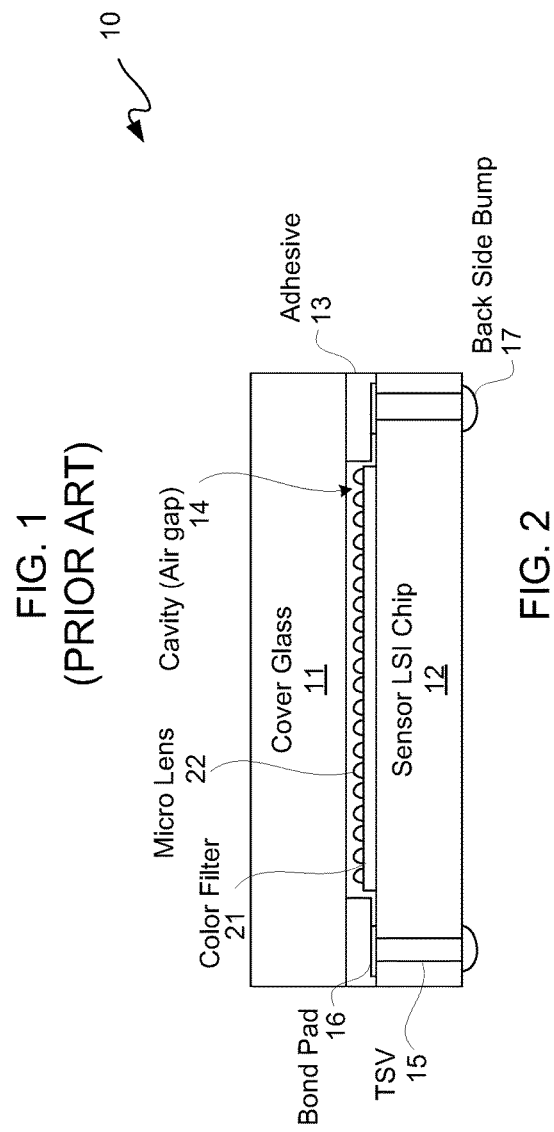
FIG. 2 is a cross-sectional side view illustratively depicting an exemplary the conventional image sensor device of FIG. 1.
Figure 3:
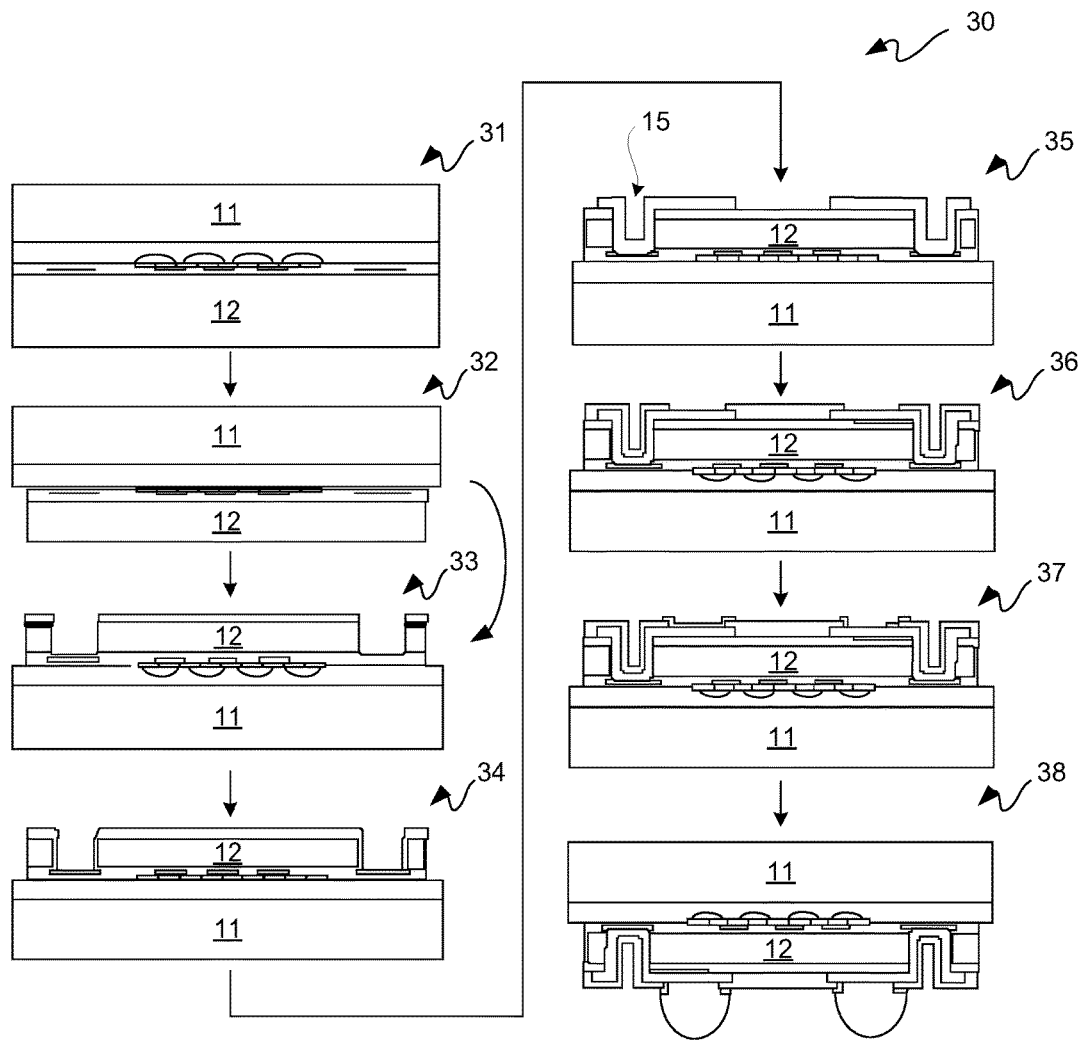
FIG. 3 is a progression of cross-sectional side views illustratively depicting an exemplary conventional process flow, which may be used to form the conventional image sensor device of FIGS. 1 and 2 for a bulk substrate device.

Before a detailed description is provided, a more detailed description of the context of the prior art may be useful. Along those lines, FIG. 1 is a top-down perspective and cut-away view illustratively depicting an exemplary conventional image sensor device 10. FIG. 2 is a cross-sectional side view illustratively depicting the conventional image sensor device 10 of FIG. 1. FIG. 3 is a progression of cross-sectional side views illustratively depicting an exemplary conventional process flow 30, which may be used to form the conventional image sensor device 10 of FIGS. 1 and 2. As image sensor device 10 and process flow 30 are known, unnecessary detail in the description thereof is not provided for purposes of clarity and not limitation.

Generally, with reference to FIGS. 1-3, a transparent cover sheet, such as a sheet of glass ("cover glass") 11 for example, and a large-scale integration ("LSI") image sensor chip or die ("substrate" or "sensor chip") 12 having a pixel array 18 are attached to one another with an adhesive 13 defining a cavity 14 between them. In the cavity 14, there is/are one or more micro lenses ("micro lens") 22 on one or more color filters ("color filter") 21. The color filter 21 may be on a front side surface of an LSI image sensor chip or die 12 ("substrate" or "silicon"). There may be a slight gap between a lower surface of the cover sheet ("cover glass" or "glass") 11 and an upper surface of the micro lens 22.

In process 30, after attaching or bonding at 31, there may be a back-grinding and stress relieving of the substrate 12 at 32, where the glass 11 may be used as a carrier. The substrate 12 may be flipped over and via etched at 33, followed by formation of via insulation at 34 and via metalization at 35 to form through substrate vias, such as through silicon vias ("TSVs") 15 for example. On a back side surface of the substrate 12, via metalization of such TSVs 15 may be passivated at 36 followed by under-bump metalization at 37 to form bond pads 16 including any redistribution layers and then forming of external interconnects ("bumping") at 38, such as to form back side bumps 17. Because bumps 17 of bumping are interconnected to TSVs 15 of the substrate 12, a separate controller die or chip (not shown in FIGS. 1 and 2) is conventionally coupled alongside of or otherwise spatially removed from a package of image sensor device 10.

Figure 4:
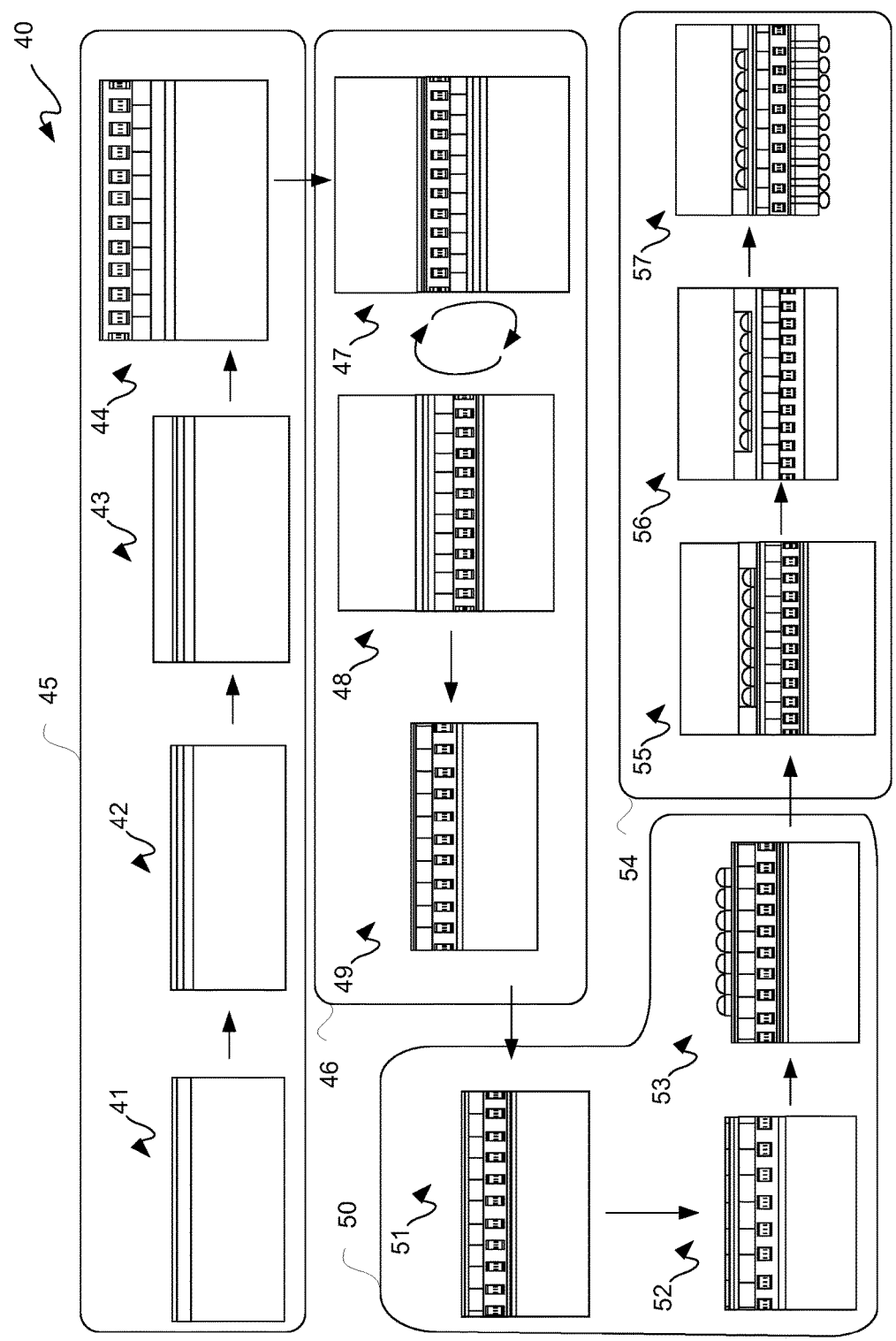
FIG. 4 is a progression of cross-sectional side views illustratively depicting an exemplary conventional process flow, which may be used to form the conventional image sensor device of FIGS. 1 and 2 though for a substrate-on-insulator substrate device.

While process flow 30 is for a bulk silicon substrate 12, one or more other semiconductive material(s) may be used for such substrate 12. Furthermore, rather than a bulk substrate 12, a substrate on insulator wafer may be used, such as for example a silicon on insulator ("SOI") wafer. Along those lines, FIG. 4 is a progression of cross-sectional side views illustratively depicting an exemplary conventional process flow 40, which may be used to form back side illuminated (BSI) image sensor device 10 of FIGS. 1 and 2, though for an SOI device. This formation may be done with wafer-level packaging ("WLP"). As process flow 40 is known, unnecessary detail in the description thereof is not provided for purposes of clarity and not limitation.

Operations 45 are for Front-End Of Line ("FEOL") processing. At 41, an SOI wafer is obtained. At 42, gradient implants are implanted into the wafer. At 43, epitaxial growth and annealing is performed. At 44, pixel and photo diode processing is performed.

Operations 46 are for Back-End Of Line ("BEOL") processing. At 47, bonding to a final carrier is performed. At 48, the wafer and carrier is flipped over. At 49, back side grinding or other thinning of the SOI wafer is performed down to the buried oxide layer ("BOX") to expose a back or underside of the SOI wafer. This operation at 49 may include laser annealing.

Operations 50 are for forming optical components. At 51, one or more anti-reflective ("AR") coatings are deposited. At 52, color filters are formed. At 53, microlenses are formed.

Operations 54 are "packaging" operations. At 55, glass is bonded to the wafer. At 56, front side grinding or other thinning of the carrier is performed. At 57, TSVs for a three dimensional package or a WLP are formed followed by formation of bumps.

Figure 6:
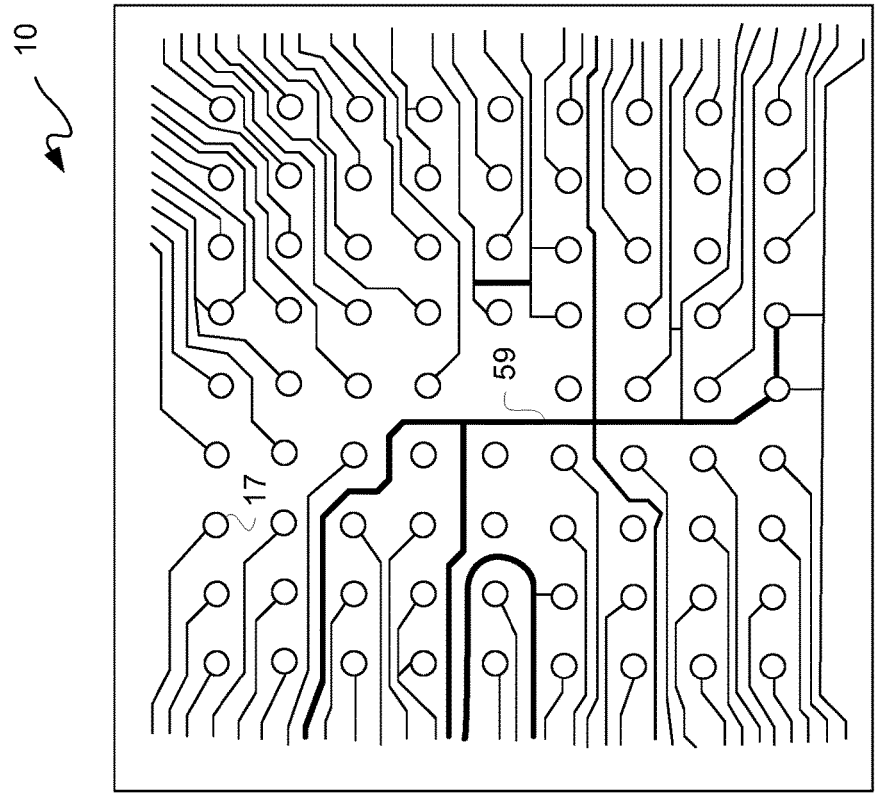
FIG. 6 is a bottom plan view depicting an exemplary conventional image sensor device.
Figure 5:
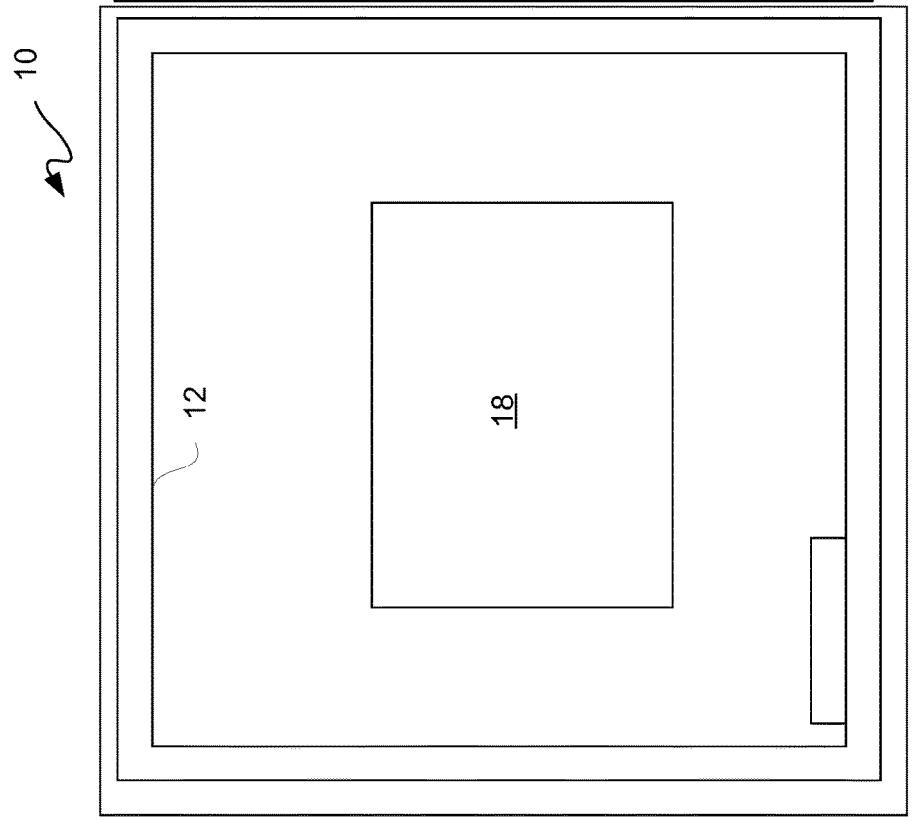
FIG. 5 is a top plan view depicting an exemplary conventional image sensor device.

FIG. 5 is a top plan view depicting an exemplary conventional image sensor device 10, and FIG. 6 is a bottom plan view depicting an exemplary image sensor device 10. In FIG. 5, an image sensing portion, such as a pixel array 18 (center box) of an image sensor device 10 is conventionally located in a middle portion of a substrate 12, and so TSVs 15 conventionally are around a perimeter of image sensor device 10 with bond pads coupled to such TSVs. In other words, because an image sensor device 10 is a sensitive active device during operation, conventionally other circuitry is disposed away from such image sensing portion, such as pixel array 18. However, bumps 17 for coupling to such perimeter of bond pads 16 may be coupled through traces 59 on a back side of such substrate 12 as depicted in FIG. 6.

Bumps 17 and the ball grid array (BGA) at the bottom of the image sensor device shown in FIG. 6 is just one example of how the image sensor device is electrically connected to the motherboard. In another example, the bottom side of the image sensor device is attached to an organic substrate using an adhesive and electrically connected to this organic substrate via wire bonds directly connecting the top of the image sensor to a the organic substrate.

Conventionally, a controller and image processor (not shown) is a separate chip externally coupled to a plurality of bumps 17 of such back side of such substrate 12 as depicted in FIG. 6. Because an image sensor device 10 is conventionally a low-profile device, in the past this has meant having TSVs 15 directly connected to bond pads 16 for direct connection with traces 59 and bumps 17, such as previously described.

To reduce propagation delay between an image sensor device and a controller therefor and provide a low profile device, described below is an image sensor device package having another die embedded with an image sensor device in a common package. In the example below, a controller die ("controller") is embedded with an image sensor device in a common package; however, in another implementation, another type of die, e.g. an image processor die generally used in a camera or other imaging device, may be embedded with an image sensor device in a common package.

FIG. 7 is a cross-sectional side view illustratively depicting an exemplary image sensor device 100 with dicing lanes 160 for sensor dies 170 in substrate 110, and FIG. 8 is a cross-sectional side view illustratively depicting an exemplary image sensor device 100 with dicing lanes in mold cavities, such as channels, 140. Image sensor devices 100 of FIGS. 7 and 8 are similar. However, in image sensor device 100 of FIG. 8, rather than dicing in lanes of a wafer of substrate 110 having sensor dies 170, dicing through mold cavities 140, namely spaced apart sensor dies 170 defining mold cavities or channels therebetween, may be used. Even though an image sensor die 170 is described, other types of integrated circuit dies having input and/or output signal lines proximally disposed to an outer perimeter thereof may be used.

The implementation of FIG. 8 may be for a reconstituted wafer for substrate 110, whereas the implementation of FIG. 7 may be for a wafer-level process or WLP. Even though either implementation illustratively depicted may be used, for purposes of clarity by way of example and not limitation, the implementation associated with FIG. 7 is generally further described though the implementation associated with FIG. 8 may be understood from the following description.

Figure 9:
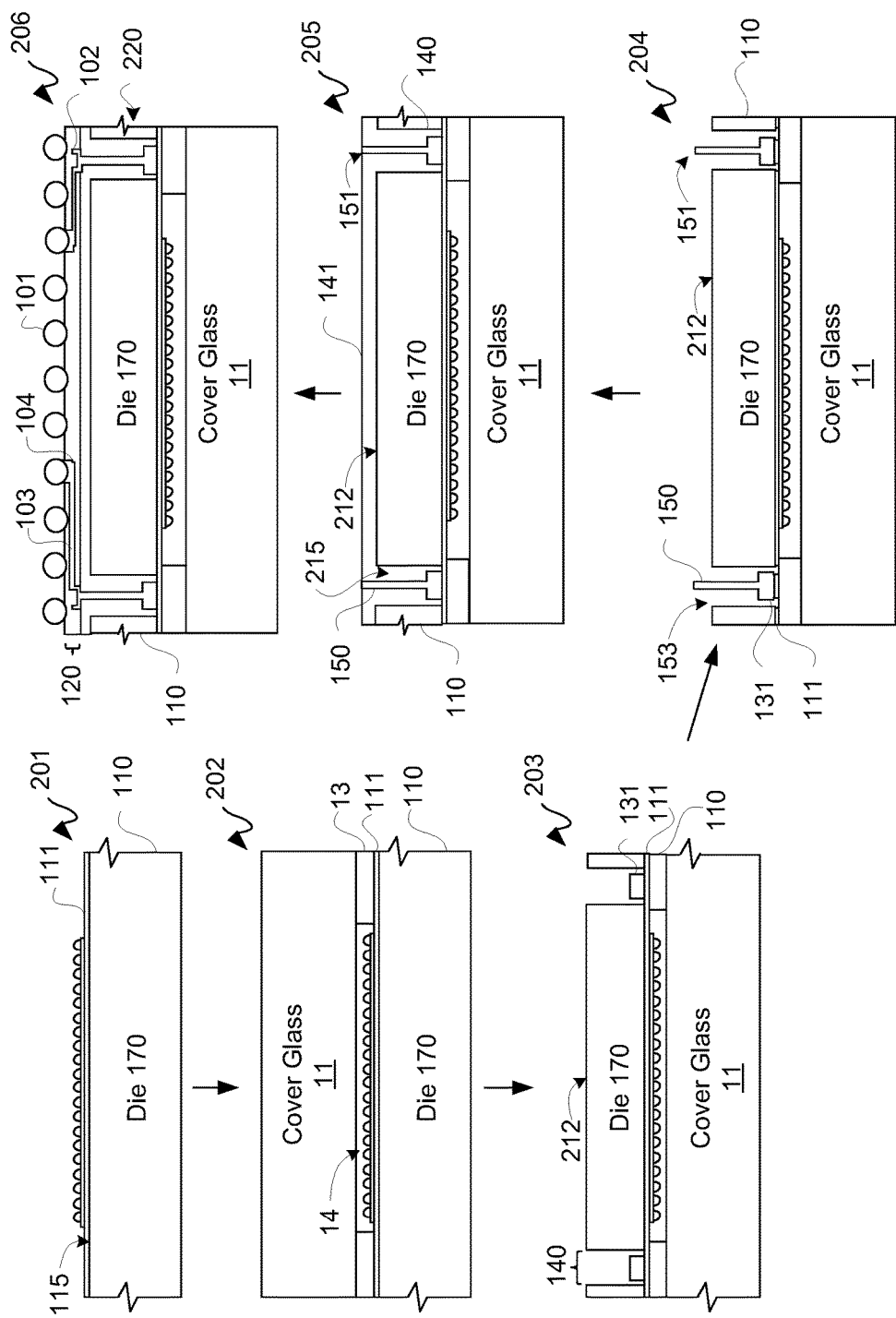
FIG. 9 is a progression of cross-sectional side views illustratively depicting an exemplary process flow, which may be used to form the image sensor device of FIG. 7.

Along those lines, FIG. 9 is a progression of cross-sectional side views illustratively depicting an exemplary process flow 200, which may be used to form image sensor device 100 of FIG. 7. The description herein is for a wafer-level process ("WLP") flow, in contrast to a substrate/chip in a mold or a reconstituted wafer process flow. However, the following description likewise applies to a reconstituted wafer process as shall be apparent to one of skill in the art.

An image sensor wafer or substrate 110 may have multiple image sensor devices to be diced from one another, though only a single image sensor die 170 is illustratively depicted for purposes of clarity and not limitation. As described hereinbelow, slots, channels and/or vias may be formed in such a wafer from and in a back side thereof. In an implementation, a molding material may be deposited, including without limitation injected, along a back side surface of such wafer including into dicing lanes thereof. In another implementation, channels and/or vias are formed in a wafer from a back side thereof; however, these channels and/or vias are not metalized as in a conventional TSV flow. With simultaneous reference to FIGS. 7 through 9, image sensor devices 100 are further described.

At 201, a substrate 110 may be obtained having image sensor dies 170 and a conductive layer, such as a metal layer, 111 may be deposited or otherwise plated onto an upper surface 115 of substrate 110. Substrate 110 may be an optically sensitive/activatable semiconductor wafer having a plurality of sensor dies 170 formed therein. This wafer may be a silicon wafer or other semiconductor wafer. This example implementation is for a "front side" image sensor device 100. Such substrate 110 may have an anti-reflective coating ("ARC"; not shown in this figure for purposes of clarity and not limitation) deposited on upper surface 115, as is known. A metal interconnect layer, namely metal layer 111, on an upper surface 115 of substrate 110 may be used as an etch stop layer for a "via" etch, or more appropriately a channel etch, as described below in additional detail. In this example, only one metal layer 111 is depicted for simplicity; however, this or another implementation may have one or more metal layers to effectively connect diodes under pixels to bond pads 131 at the periphery.

Metal layer 111 may be plated on an active upper surface 115 outside of an optically activatable portion or surface of die 170 for physically coupling to bond pads 131 for electrical conductivity, where bond pads 131 are formed in sensor dies 170 at or proximal to an upper surface or front side surface of substrate 110 as part of an image sensor die fabrication process. For purposes of clarity by way of example and not limitation, a micro lens 22 and a color filter 21 are illustratively depicted in FIGS. 7 through 9 but not described in unnecessary detail for purposes of clarity and not limitation. Generally, electrical connections to diodes under pixels may be established though these metal layers interconnecting such pixels to pads 131. Hence, traces or lines of such metal layers may travel to active areas and pixels. In a front side image sensor die, metal layers are above or on top of diodes, which may obstruct a light path. However, in a back side image sensor die ("BSI sensor"), diodes may be above or on top of such metal layers, namely metal lines are below such diodes. Optionally, stud bumps 130 may formed at 201 to be positioned on metal layer 111 portions corresponding to upper bond pads 131 on a surface thereof opposite wire bond wires 150 to provide additional rigidity to upper bond pads 131.

A glass or cover glass or other optically suited material ("cover glass") 11 may be coupled to a substrate 110 with an adhesive 13 at 202, such as to provide an offset for a cavity 14 for a micro lens 22 and a color filter 21. Adhesive 13 may be used to adhere glass cover 11 to at least one of a conductive layer, such as metal layer 111, or a front side surface 115 of substrate 110, where glass cover 11 is offset from and over an optically-activatable portion of a front side surface 115 for defining a gap, such as air cavity 14, between an underneath side of glass cover 11 and such portion of a front side surface 115. Cover glass 11 may be a glass wafer coupled to an image sensor wafer or substrate 110 using adhesive 13. In an implementation, air cavity 14 may be approximately 50 to 100 microns thick or tall. In another example, no separate cover glass may be coupled to or be a part of an image sensor device.

Adhesive 13 may likewise be around a pixel array area, namely generally proximal to a perimeter of die 170 without being located in a pixel array area. Thus, adhesive 13 may be deposited or otherwise applied to or put in contact with an upper surface of metal layer 111. Adhesive 13 may provide an offset between an upper surface of metal layer 111 and a lower surface of cover glass 11 to define a cavity 14 therebetween, such as previously described.

At 203, a substrate 110, such as a wafer, may optionally be ground, polished, or otherwise thinned to reduce overall thickness prior to drilling or etching channels or slots therein. Further at 203, substrate 110 may be drilled or etched or otherwise formed to provide vias and/or channels or slots ("channels") or mold cavities 140 therein. This channel etching or drilling may be from a back side surface 212 of a wafer or substrate 110 used to form dies 170 down toward a front side surface of such a wafer or substrate 110. In another implementation, etching may form a chamfered edge along one or more sides of dies 170 of substrate 110. Although, side walls of vias or channels are depicted to be vertical side walls, in another implementation such sidewalls may slanted at an angle with respect to the vertical direction.

For etching, a masking layer may be patterned prior to etching using a mask, and this may add additional costs. To avoid this additional cost, direct laser drilling may be used to form channels 140 across a back side surface 212 of a wafer or substrate 110 for multiple image sensor dies 170 thereof. Such channels may be located at or proximal to the peripheries of active areas of image sensor dies 170. Thus, each image sensor die 170 may effectively have a continuous or discontinuous channel 140 around an active area thereof. Channels 140 may extend from a lower surface of substrate 110 completely through to an upper surface of substrate 110, and thus may be thought of as through-substrate channels 140.

Etching or drilling may be used to temporarily expose or reveal surfaces of bond pads 131 generally at the bottom of a channel 140. Whether etching or drilling, metal layer 111, as well as bond pads 131, may be used as a stop layer at 203 for such etching or drilling. Moreover, such etching or drilling may be selective to material of wire bond wires 150, as well as bond pads 131 and metal layer 111.

In this example, bond pads 131 are at least partially disposed within a channel 140. However, for bond pads formed of metal layer 111 for example, a channel 140 may be aligned to bond pads, or vice versa, though at least partially disposed outside a channel 140. Accordingly, generally channels and bond pads are aligned with one another, with such bond pads at or proximal to an upper surface of substrate 110 for access from a lower surface of substrate 110 via a channel 140.

At 204, bond pads 131, which may be formed with a bondable metalization, may optionally be oxide and/or metal etched at a bottom of such channels 140. Along those lines, this etching may be to remove oxidation prior to wire bonding. Optionally, at 204 a metal etch may be used to electrically disconnect two or more bond pads 131 from one another interconnected to one another by metal layer 111. However, generally it may be easier to pattern metal layer 111 and form separate bond pads during a plating/BEOL process. Thus, wire bond wires 150, bond pads 131, and metal layer 111 may be formed of different materials for selectivity to partially etch metal layer 111, which may partially etch bond pads 131 too, while not significantly removing material of wire bond wires 150. In an example, the top metal layer of metal layers 111 may be formed of aluminum and multiple bottom layers may be formed of copper, as wire bonding on aluminum pads is a conventional process.

Bond pads 131 may be disposed around a pixel array. A subsequent optional oxide and/or metal etch at a bottom of such channels 140 may be used to enhance subsequent bonding thereto and/or to physically disconnect bond pads 131 from one another due to metal layer 111, as illustratively depicted at operation 204. However, for purposes of clarity by way of example and not limitation, it shall be assumed that such optional etching is not used in this implementation.

Further at 204, wire bond wires 150 may be bonded to upper surfaces of conductive bond pads 131 along bottoms of channels 140 of a wafer or substrate 110. For a WLP, wire bond wires 150 may be bonded to bond pads 131 located along the base or bases of such one or more trenches or channels 140. Wire bond wires 150 may be ball bonded or use another type of bonding at 204 to bond pads 131.

Wire bond wires 150 may extend vertically away from bond pads 131. After bonding, severing of feed wire of wire bond wires 150 may be performed above channels 140 for having wire bond wires 150 exit channels 140 at the top. Along those lines, tips 151 of wire bond wires may extend above an upper surface 212 of dies 170 of a wafer or substrate 110, namely, extend above an upper opening 153 of channels 140 to be located outside of channels 140, after severing from a feed wire. Such a feed wire may be a copper feed wire for copper bond pads 131. Aluminum or gold wires can additionally or alternatively be used. Optionally, a coated copper wire, e.g. palladium coated copper wire, or other wire bond wire may be used. In another example, tips 151 of wire bond wires 150 may be flush with or even below an upper surface 212 of dies 170.

Rather than using TSVs plated or filled with a conductive material, such as a metal for example, such vias and/or channels 140 may have wire bond wires 150 extending from a bottom or bottoms thereof. Wire bond wires 150 may be of an array, and may be known as BVA™ wires, referring to a "free standing" array of wire bonds. Thus, BVA wire bonds may be disposed in channels 140 with tips 151 extending out of and above such channel openings 153 in a free standing configuration prior to molding. In another implementation, tips 151 may be even with or below channel openings 153.

Another set of bond pads 102, which may be part of or interconnects for a redistribution layer ("RDL") 120, may be formed over filled channels 140, generally on a same plane as a back side surface of die 170. Moreover, bond pads 120 may be formed in or partially in channels 140 to further reduce overall thickness of image sensor devices 100. However, for purposes of clarity by way of example and not limitation, it shall be assumed that bond pads 102 are formed as part of an RDL 120, where such RDL 120 is formed on a molding layer 141, including without limitation an epoxy molding compound, as described below in additional detail. Bond pads 102 may be formed such that they interconnect to tips 151 located above, flushed or below upper surface 212 of a die 170.

Along those lines, each die 170 is in a face-up orientation in FIGS. 7 and 8. By having upper ends (lower ends at operation 204) of wire bond wires 150 and associated upper bond pads 131 disposed generally in a same or common horizontal plane as a face-up front face/front side or active surface 115 of substrate 110, connections from substrate 110, or more particularly dies 170 thereof, to upper bond pads 131 may be formed without having to wire bond down to a lower surface. This common orientation of position may shorten overall wire length for some applications and/or may avoid plating or filling TSVs in substrate 110. Having to wire bond down to a lower surface may be in some package-in-package configurations, such as in U.S. Pat. No. 8,618,659, which is incorporated by reference herein in its entirety for all purposes.

At least a portion of wire bond wires 150 may extend in channels 140, which is referred to as mold cavity 140, as a molding material 215 is deposited, injected, or otherwise loaded into such channels 140 at 205. This mold cavity 140 may be in a mold (not shown) in which one or more singulated in-process image sensor devices 100 are loaded, such as for a reconstituted wafer; or for WLP, channels 140 may be formed along perimeters of dies 170 of substrate 110, such as into image sensor dies 170 proximal to one or more sides thereof. For purposes of clarity by way of example, it shall be assumed that molding for WLP is used for the following description, though the following description generally applies to both implementations.

Deposition of molding material 215 may cover a back side surface or lower surface 212 (an upper surface at operation 205) of die 170 or generally substrate 110, which may include another molding material or coating, to provide molding material ("molding") layer 141. In an implementation, at 205 a wafer or substrate 110 may be transfer molded with molding material 215 with a mold assist film (not shown) to allow tips 151 to extend above an upper surface of molding layer 141. Molding material 205 and molding layer 141 may be formed of the identical material. Film assist molding may be used to keep upper ends 151 of wires 150 from being covered with molding material 215 for subsequent interconnection with lower bond pads 102. With upper ends 151 of wires 150 extending above an upper front face surface of substrate 110, in this example implementation molding material 215 may be deposited and then ground back to provide a planarized surface of molding layer 141 and upper ends 151 of wires 150 for formation of lower bond pads 102.

In another implementation, tips 151 may be completely covered after molding at 205, and back grinding or polishing of an upper surface of molding layer 141 may temporarily expose upper ends 151 of wire bond wires 150 for physical connection with bond pads 102 to be formed.

To recapitulate, wire bond wires 150 may be bonded to upper bond pads 131 at 204 followed by deposition of molding material 215 at 205, and then such upper ends (lower ends with respect to FIGS. 7 and 8) 151 of wire bond wires 150 may subsequently be interconnected to lower bond pads 102, as described below in additional detail.

At 206, bond pads 102 may be formed over upper ends 151 of wire bond wires 150. An RDL 120 may be formed after formation of bond pads 102. RDL 120 may include one or more conductive layers and one or more dielectric layers. Optionally, bond pads 102 may be formed as part of RDL 120. This inverse orientation effectively converts lower bond pads 102 to base bond pads. Thus, base bond pads 102 may be generally in a same or common horizontal plane as a back side lower surface of substrate 110, or more particularly image sensor dies 170 thereof for a WLP. This allows for a face-up configuration of an image sensor die 170 or a substrate 110 with base or lower bond pads 102 being associated with a back side surface of such face-up oriented substrate 110, which is an opposite orientation with respect to that in U.S. Pat. Pub. No. 20140175671 A1, which is incorporated by reference herein in its entirety for all purposes.

As lower bond pads 102 may be formed on molding layer 141, and as RDL 120 may be formed on lower bond pads 102, lower bond pads 102 as well as RDL 120 may not come into direct contact with substrate 110, or more particularly an associated image sensor die 170. In an implementation at 206, traces 103 of RDL 120 may be used to couple a perimeter of lower bond pads 102 to bump pads or receptors 104 for interconnection with associated bumps 101. Accordingly, substrate 110, or more particularly an image sensor die 100, may have a front face up orientation with a shorter wiring path to reduce signal propagation delay for operation of such an image sensor device 100.

Optionally, one or more chips or dies may be coupled to RDL 120, generally at a back side of image sensor device 100 to provide a multi-die or multi-chip image sensor module. Such other chip or die may include an image processor or a controller chip.

One or more operations associated with forming a TSV including forming a dielectric boundary, a barrier layer, a seed layer, and an associated TSV metal plating may be avoided. Having an RDL 120 on one common surface, namely on only mold material of molding layer 141 in this example implementation and on no other material surface, may provide better reliability in comparison to conventional Fan-Out Wafer Level Packaging ("FOWLP"), as for example RDL 120 metal is not transitioned between an Si substrate surface, such as of a wafer or substrate 110, and a molding material surface of molding material 215. Furthermore, a coefficient of thermal expansion ("CTE") of molding material 215, or a combination of molding and/or coating layers, of molding layer 141 may more closely correspond to a PCB material.

Moreover, molding layer 141 may have a larger surface area than substrate 110 for purposes of bump pads 104, namely for purposes of "bumping out" for providing a FO capability. A conventional CMOS image sensor device with TSVs has dimensional restrictions due to locations of such TSVs; however, by avoiding TSVs, these dimensional restrictions may be avoided. Along those lines, more of an edge area around a perimeter of substrate 110 may be etched to make such additional space available for wire bond wires 150 in comparison to TSVs. Along those lines, in another implementation, RDL 120 may extend up (down at operation 206) along sidewalls 220 of substrate 110. In an implementation, RDL 120 may be formed partly on molding layer 141 and partly on substrate 110, like in a FOWLP.

FIG. 10 is a cross-sectional side view illustratively depicting an exemplary image sensor device 100 with dicing lanes 160 for image sensor dies 170 formed in a substrate 110, where image sensor dies respectively have an optional embedded die 300 coupled to thereto. An embedded die 300 may be a controller die, an image processor die or another chip performing any other functionality that is located in die cavities 301 of corresponding image sensor dies 170. Although only one die 300 and only one cavity 301 is illustratively depicted in FIG. 10, there may be more than one die 300 or more than one cavity 301 at the back side of an image sensor device 100. In another implementation, there may be more than one die in one cavity.

Even though singulation of an image sensor device 100 from a substrate 110 is described herein, in another implementation more than one image sensor die 170 may be used in an image sensor device 100, where such image sensor dies 170 may be coupled to one another after dicing from a substrate 110. Accordingly, such image sensor dies 170 may have a substrate 110 and a glass cover 11 respectively in common with one another after dicing.

FIG. 11 is a cross-sectional side view illustratively depicting an exemplary image sensor device 100 with dicing lanes 160 for an image sensor die 170 formed in "thinned" substrate 110 with an optional embedded die 300 coupled to image sensor die 170. Even though a single embedded die 300 is illustratively depicted in FIG. 11, in other implementations more than one embedded die may be used. Furthermore, even though embedded die 300 is described below as a "controller" 300 as associated with a controller for controlling an image sensing device, as described herein, in another implementation embedded die 300 may be a driver or an image processor die. However, for purposes of clarity by way of example and not limitation, it shall be assumed that embedded die 300 is a controller 300. Although only one embedded die 300 is illustratively depicted in FIG. 11, there may be more than one embedded die 300 at the back side of an image sensor device 100.

Figure 12:
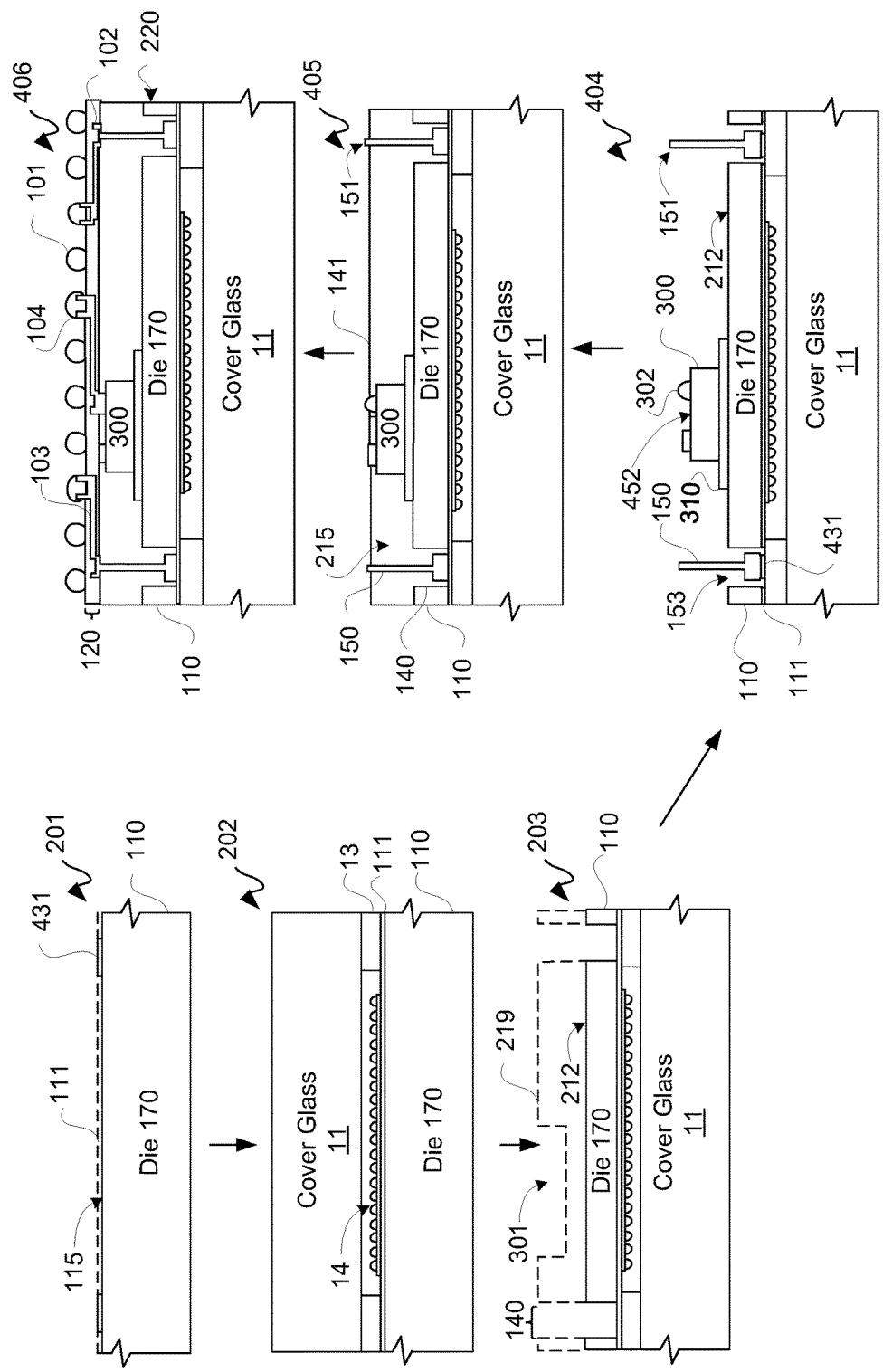
FIG. 12 is a progression of cross-sectional side views illustratively depicting an exemplary process flow, which may be used to form the image sensor device of FIG. 11.

An image sensor device 100 may be provided in a single package with a controller 300 optionally embedded in a packaged image sensor device 100. FIG. 12 is a progression of cross-sectional side views illustratively depicting an exemplary process flow 400, which may be used to form image sensor device 100 of FIG. 11. Even though the following description is for a WLP process 400, the following description may be used in a reconstituted wafer process as shall be apparent to one of skill in the art from the following description.

With simultaneous reference to FIGS. 7 through 12, image sensor devices 100 are further described. Along those lines, as details with respect to image sensor devices 100 of FIGS. 10 through 12 are the same or similar to image sensor devices 100 of FIGS. 7 through 9, some of those same or similar details are not repeated for purposes of clarity and not limitation.

At 201, a metal layer 111 may be deposited or otherwise plated onto an upper surface 115 of substrate 110, such as a wafer having a plurality of sensor dies 170 formed therein, as previously described. Optionally, metal layer 111 may be patterned to provide bond pads 431 for interconnecting to image sensor die 170. However, for purposes of clarity by way of example and not limitation, a continuous metal layer 111 in cross-section is illustratively depicted. Again, optionally, stud bumps 130 may formed at 201 to be positioned on metal layer 111 portions corresponding to upper bond pads 431 on a surface thereof opposite wire bond wires 150 to provide additional rigidity to upper bond pads 431.

Such substrate 110 may have an anti-reflective coating ("ARC"; not shown in this figure for purposes of clarity and not limitation) deposited on upper surface 115, as is known. Again, for purposes of clarity by way of example and not limitation, a micro lens 22 and a color filter 11 are illustratively depicted in FIGS. 10 through 12 but not described in detail for purpose of clarity and not limitation.

At 202, a glass cover glass 11 may be coupled to a substrate 110 with an adhesive 13, as previously described.

At 203, a substrate 110, such as a wafer, may be ground, polished, or otherwise thinned to reduce overall thickness prior to drilling or etching channels or slots therein, as similarly previously described. In this implementation, substrate 110 may be thinned for coupling a controller 300 to a sensor die 170 thereof for a low-profile image sensor 100.

Further at 203, substrate 110 may be laser drilled or wet or dry etched or otherwise formed to provide through channels 140 therein, as previously described. For image sensor device 100 of FIG. 10, a controller die cavity 301 may be formed when forming mold cavities 140 at 203, as generally indicated by dashed line 219. Generally, substrate 110 is much thicker than needed for formation of image sensors for image sensor device 100. Most of this thickness is to provide separation of image sensors of image sensor device 100 from heat and/or interfering signals at an interconnect side of image sensor device 100. However, generally there may be about 10 or fewer wires that interconnect to controller 300, and controller 300 may have a limited amount of circuitry generating heat. Additionally, controller 300 may have a much smaller surface area than an image sensor die 170 of substrate 110. In short, controller 300 may have a small thermal impact. However, in another implementation, an image processor die 300 may be used. Furthermore, controller die cavity 301 may be formed off to one side of substrate 110 to reduce possibility for thermal interference with sensors of a pixel array of image sensor die 170. A controller die 300 may be coupled to a back side surface of substrate 110 to be at least partially in controller die cavity 301.

However, for purposes of clarity by way of example and not limitation, it shall be assumed that image sensor device 100 is formed as described with reference to FIG. 12, as previously stated. Again, channels 140 may be located at or proximal to the peripheries of active areas of image sensor dies 170. Thus, each image sensor die 170 may effectively have a continuous or discontinuous channel 140 around an active area thereof. Again, whether etching or drilling, metal layer 111 may be used as a stop layer at 203.

However, in this example, metal layer 111 is used for providing bond pads, such as bond pads 431. Bond pads 431 may be disposed around a pixel array of sensor die 170. Along those lines, bond pads 431 of metal layer 111 may be formed with a bondable metalization, and a subsequent oxide and/or metal etch at a bottom of such channels 140 may optionally be used to enhance subsequent bonding thereto and/or to optionally physically disconnect bond pads 431 from one another, as illustratively depicted at operation 404. With respect to the former, this etching may be to remove oxidation prior to wire bonding. However, for purposes of clarity by way of example and not limitation, it shall be assumed that such optional etching is not used in this implementation.

At 404, a back side of controller or image processor die 300 may be coupled to a back side of sensor die 170, namely along upper surface 212, with an adhesive 310. Along a front side surface of controller 300, namely upper surface 452, there may be die pads and/or interconnects, generally contacts 302.

Additionally, at 404, wire bond wires 150 may be bonded to upper surfaces of bond pads 431 along bottoms of channels 140 of a wafer or substrate 110. For a WLP, wire bond wires 150 may be bonded to bond pads 431 located along the base or bases of such one or more trenches or channels 140. Wire bond wires 150 may be ball bonded or use another type of bonding at 404 to bond pads 431.

Wire bond wires 150 may extend vertically away from bond pads 431. After bonding, severing of feed wire used to form wire bond wires 150 may be performed above channels 140. Along those lines, tips 151 of wire bond wires may extend above or to an upper surface 452 of controllers 300 adhered to corresponding sensor dies 170 of a wafer or substrate 110, namely, extend above an upper opening 153 of channels 140, after severing from a feed wire.

Again, rather than using TSVs plated or filled with a conductive material, such as a metal for example, such vias and/or channels 140 may have wire bond wires 150 extending from a bottom or bottoms thereof. Wire bond wires 150 may be of an array, and may be known as BVA™ wires. Thus, BVA wire bonds may be disposed in channels 140 with tips 151 extending out of and above such channel openings 153 in a free standing configuration prior to molding. In this implementation, tips 151 may be even with or above upper surface 452 of controller 300, and bond pads 102 for an RDL 120 may be formed on a molding layer 141, as described below in additional detail.

Along those lines, image sensor dies 170 are in a face-up orientation in FIGS. 10 and 11, and controllers 300 are in a face-down orientation in those respective figures. Again, by having upper ends (lower ends at operation 404) of wire bond wires 150 and associated upper bond pads 431 disposed generally in a same or common horizontal plane as a face-up front face or active surface 115 of substrate 110, connections from substrate 110, or more particularly dies 170 thereof, to upper bond pads 431 may be formed without having to wire bond down to a lower surface. This common orientation of position may shorten overall wire length for some applications and/or may avoid plating or filling TSVs in substrate 110. Additionally, by having one or more embedded dies in an image sensor device in a face-down orientation, such one or more embedded dies, such as controller 300 in the examples of FIGS. 10 and 11, may be directly interconnected to a circuit board, such as a PCB, to shorten signal path length. Controller or image processor die 300 in FIGS. 10 and 11 may, though need not be, positioned coaxially with respect to a center of a pixel array of image sensor die 170.

A portion of lengths of wire bond wires 150 extends in channels 140, which is also referred to as mold cavities 140, as a molding material 215 is deposited, injected, transferred or otherwise loaded into such channels 140 at 405. This mold cavity 140 may be in a mold in which singulated in-process image sensor devices 100 are loaded for molding, such as for a reconstituted wafer; or for a WLP, channels 140 may be formed along perimeters of dies 170 of substrate 110, such as into dies 170 proximal to one or more sides thereof, and such substrate 110 may be loaded into a mold for injection molding of a molding layer 141. For purposes of clarity by way of example, it shall be assumed that molding for WLP is used for the following description, though the following description generally applies to both implementations.

Deposition, including without limitation by injection, of molding material 215 may coat a lower surface (an upper surface at operation 405) of substrate 110, which may include another molding material or coating, to provide molding layer 141. In an implementation, at 205 a wafer or substrate 110 may be transfer molded with molding material 215 with a mold assist film (not shown) to allow tips 151 and contacts 302 to extend above an upper surface of molding layer 141. Generally, tips 151 may be above or even with contacts 302.

Film assist molding may be used to reveal tips or upper ends 151 of wires 150 for subsequent interconnection with lower bond pads 102. Such film assist molding may be used to reveal upper end surfaces of contacts 302, as well. With upper ends 151 of wires 150 extending above an upper surface 452 of controller 300 as in this example implementation, molding material 215 may be injection deposited. In this or another implementation, a portion of upper ends of wires 150, as well as contacts 302, may be ground or polished back to planarize for physical interconnection with yet to be formed lower bond pads 102.

To recapitulate, for an image sensor device 100 of FIG. 11, substrate 110 may be thinned, which may be before or after formation of channels 140 or mold cavities 140. After thinning, a controller 300 and/or one or more other dies may be attached back side surface down to a back side surface up oriented thinned substrate 110, and, after thinning and formation of channels 140 for mold cavities 140, formation and boding of wire bond wires 150 may be performed. Attachment of controller or image processor die 300 may include using a thermally insulating adhesive 310 to attach controller 300 to a back side surface of a corresponding image sensor die 170 of substrate 110. After attachment of controller 300 and formation of wire bond wires 150, a molding material 215 may be deposited. Such molding material 215 may be deposited into channels 140 to provide mold cavities 140, as well as into controller or die cavities 301 (if present), and along back side surfaces of image sensor dies 170 of substrates 110 and over a front side surface of controller 300. Wire bond wires 150, along with contacts 302 of controller 300, may extend beyond an upper surface of molding layer 141 by use of a film assisted molding and/or by use of a grinding or polishing operation.

At 406, bond pads 102 may be formed over upper ends 151 of wire bond wires 150. An RDL 120 may be formed after formation of bond pads 102. Optionally, bond pads 102 may be formed as part of RDL 120. Again, image sensor die 170 of FIGS. 10 and 11 is in an inverse orientation, which effectively converts lower bond pads 102 to base bond pads. Thus, base bond pads 102 may be generally in a same or common horizontal plane as a back side lower surface of substrate 110, or more particularly image sensor die 170. This allows for a face-up configuration of an image sensor die 170 or a substrate 110 with base or lower bond pads 102 being associated with a back side surface of such face-up oriented substrate 110

An RDL 120 may be formed on molding layer 141, as previously described, but with contacts 302 interconnected through such RDL 120 and bump pads 104 to bumps 101, and such contacts 302 may be coupled to wires 150 for controlling image sensors of image sensor device 100. As lower bond pads 102 may be formed on molding layer 141, and as RDL 120 may be formed on lower bond pads 102, lower bond pads 102 as well as RDL 120 may not come into direct contact with substrate 110, or more particularly an associated image sensor die 170. In an implementation at 406, traces 103 of RDL 120 may be used to couple a perimeter of lower bond pads 102 to bump pads or receptors 104 for interconnection with associated bumps 101. Accordingly, substrate 110, or more particularly an image sensor device 100, may have a front face up orientation with a shorter wiring path to reduce signal propagation delay for operation of such an image sensor device 100.

Optionally, another chip or die may be coupled to RDL 120, generally at a back side of image sensor device 100 to provide a multi-die or multi-chip image sensor module. Such other chip or die may include an image processor.

One or more operations associated with a dielectric boundary, a barrier layer, a seed layer, and a metal plating associated with forming a TSV may be avoided. Having an RDL 120 on one common surface, namely on only mold material of molding layer 141 in this example implementation and on no other material surface, may provide better reliability in comparison to FOWLP, as for example RDL 120 metal is not transitioned between an Si substrate surface, such as of a wafer or substrate 110, and a molding material surface of molding material 215. Furthermore, a CTE of molding material 215, or a combination of molding and/or coating layers, of molding layer 141 may more closely correspond to a PCB material.

Moreover, molding layer 141 may have a larger surface area than substrate 110 for purposes of bump pads 104, namely for purposes of "bumping out". A conventional CMOS image sensor device with TSVs has dimensional restrictions due to locations of such TSVs; however, by avoiding TSVs, these dimensional restrictions may be avoided. Along those lines, more of an edge area around a perimeter of substrate 110 may be etched to make such additional space available for wire bond wires 150 in comparison to TSVs. Along those lines, in another implementation, RDL 120 may extend up (down at operation 206) along sidewalls 220 of substrate 110. In an implementation, RDL 120 may be formed partly on molding layer 141 and partly on substrate 110, like in a FOWLP.

Figure 13:
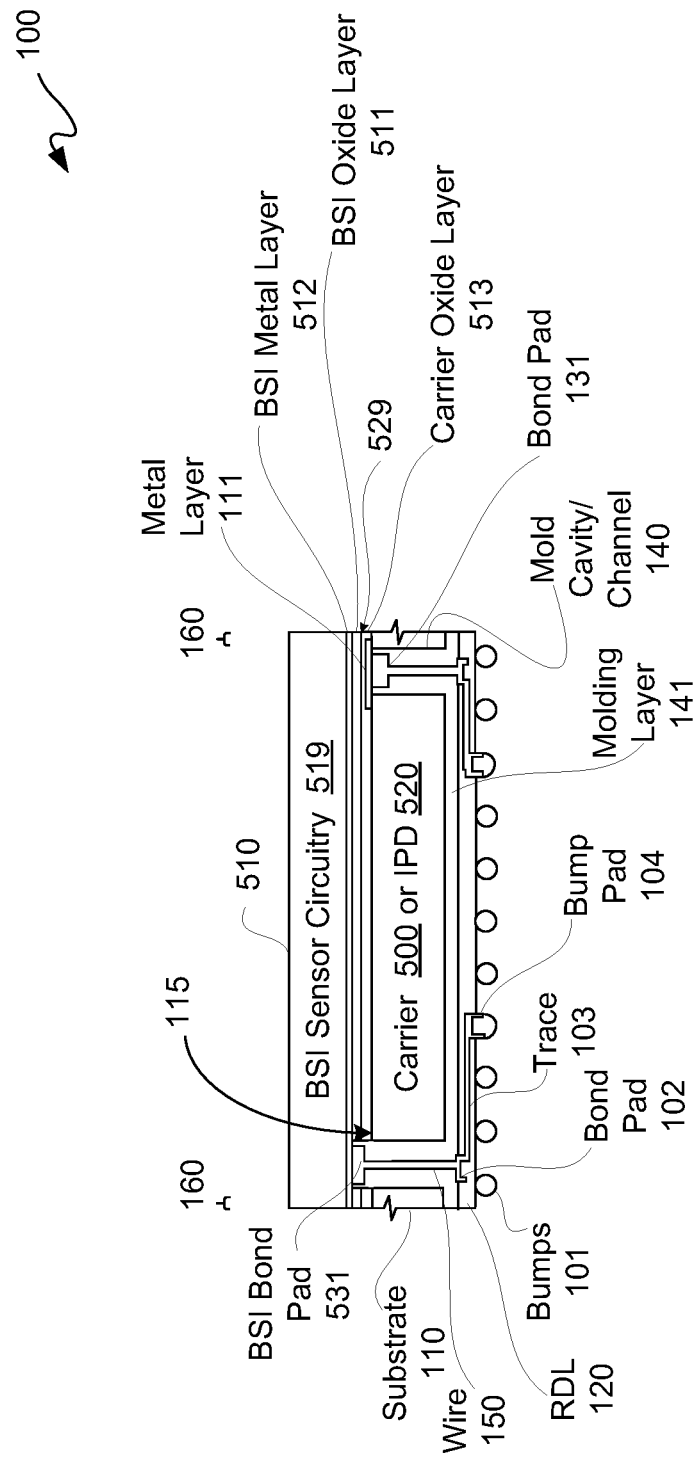
FIGS. 13 through 15 are cross-sectional side views illustratively depicting respective exemplary "back side" image sensor devices with dicing lanes for sensor dies in a substrate.
Figure 14:
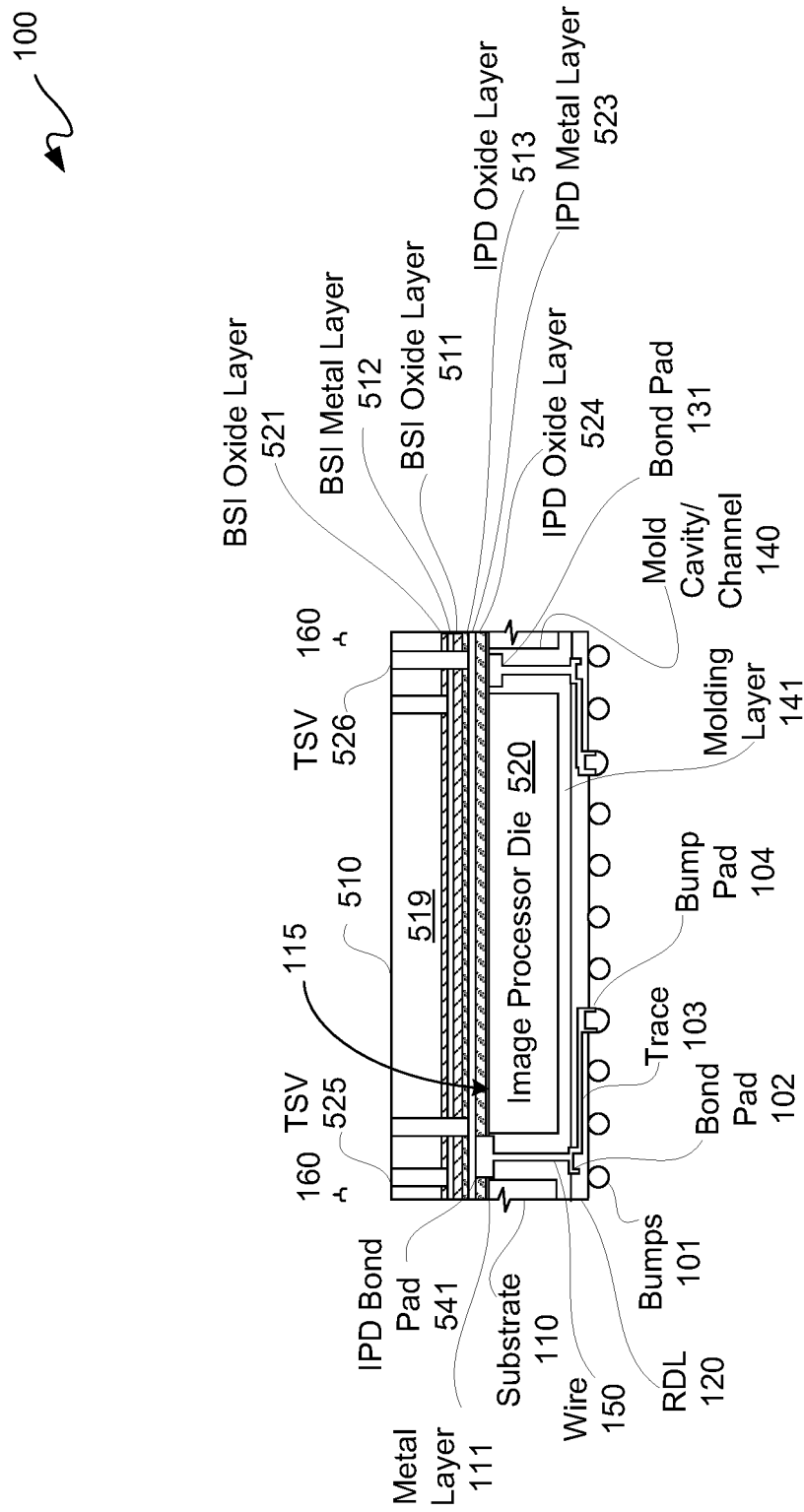
Figure 15:
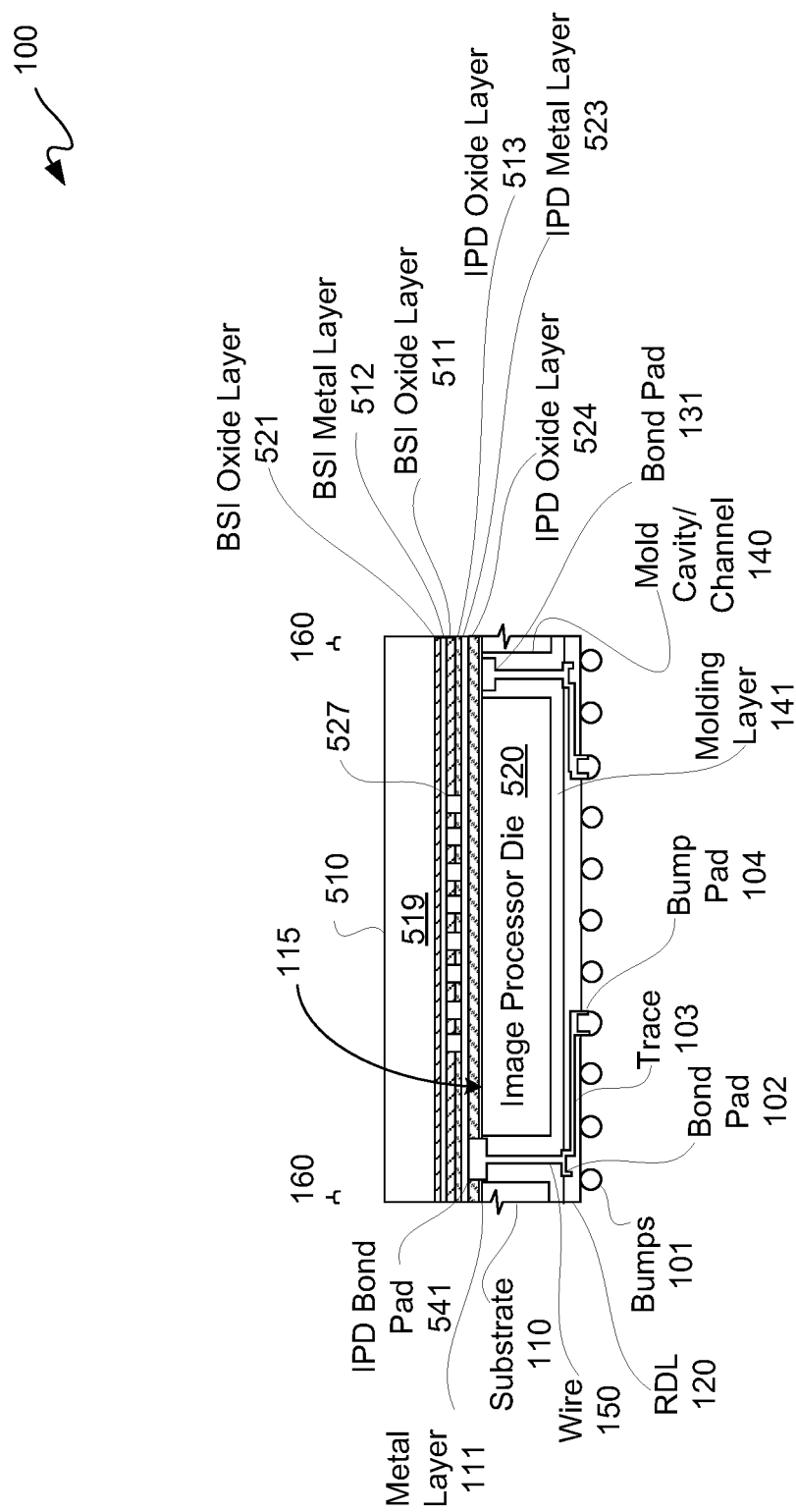

FIGS. 13 through 15 are cross-sectional side views illustratively depicting respective exemplary "back side" image sensor devices 100 with dicing lanes 160. In these exemplary implementations, back side image sensor devices 100 are illustratively depicted. In the exemplary image sensor device 100 of FIG. 13, a substrate 110 is used to provide carriers 500. While carrier 500 may be formed of a semiconductor material, such as Si, GaAs, SiGe, or other form of semiconductor wafer, carriers 500 may be formed of other materials, such as glass or a dielectric material for example.

In contrast, in FIGS. 14 and 15 back side image sensor devices 100 are from a substrate 110 formed of a semiconductor material, such as an Si, GaAs, SiGe, or other form of semiconductor wafer, used to provide image processor dies 520. Though the example herein is generally described in terms of CMOS image processor dies 520, other types of image processor dies may be used.

With reference to FIG. 13, a back side image sensor die ("BSI sensor") 510 is coupled to a substrate 110, where carriers 500, or image processor dies ("IPDs") 520, are formed from such substrate 110. Even though a BSI sensor 510 is described herein, another type of image sensor may be used in other implementations. Moreover, even though the term "die" is used throughout herein, it should be understood that a die may be in a wafer or other substrate having multiple dies. Thus, the term "die" should not be construed to be limited to only after dicing a wafer or substrate, but may include a die yet to be diced.

For purposes of clarity by way of example and not limitation, it shall be assumed that carriers 500 are formed of substrate 110, which may be a wafer. However, in another implementation, IPDs 520 may be formed of substrate 110. As many of the components of image sensor devices 100 of FIGS. 7 and 13 are the same or similar, description of those components is generally not repeated below for purposes of clarity and not limitation.

BSI sensor 510 may include BSI bond pads 531 coupled to a BSI metal layer 512, which may be coupled to BSI sensor circuitry 519. A BSI oxide or other dielectric layer 511 of BSI sensor 510 may be on a side ("underside") of BSI sensor 510. A carrier oxide or other dielectric layer 513 may be deposited on and/or grown from an upper surface 115 of substrate 110.

BSI bond pads 531 of BSI sensor 510 may at least be partially in BSI oxide layer 511 and are in channel 140. Bond pads 131 may be formed as previously described.

A BSI oxide layer 511 to carrier oxide layer 513 interface may be an oxide-to-oxide bond interface 529 for coupling BSI sensor 510 and substrate 110 to one another. Along those lines, this coupling may be done as a wafer-to-wafer coupling for subsequent dicing via dicing lanes 160. Again, though an oxide-to-oxide interface is described in this example, in another example another type of dielectric-to-dielectric interface may be used, which may or may not include an oxide layer.

After coupling BSI sensor 510 and substrate 110 to one another, channels 140 may be etched or drilled using a stop on metal etch to reveal BSI bond pads 531, as well as bond pads 131. Along those lines, metal layer 111 may have openings therein for allowing etching through into oxide layers 511 and 513 to reveal BSI bond pads 531, which may further stop on BSI metal layer 512. Wire bonds of wire bond wires 150 may then be bonded on bond pads 131 and 531 in channels 140, as previously described. Accordingly, channels 140 may be through substrate 110 channels extending at least between front and back side surfaces thereof.

Image sensor devices 100 of FIGS. 13 through 15 may be formed as generally described with reference to exemplary process flow 200 of FIG. 9. Generally, an image sensor 510 may be coupled to substrate 110, such as with an oxide-to-oxide bond for example as described herein. Such image sensor 510 and substrate 110 combination may then be drilled or generally anisotropically etched through substrate 110 and then through oxide layers 513 and 511 with a stop on metal layer 512 for BSI bond pads 531 of FIG. 13. For image sensor devices 100 of FIGS. 14 and 15, such anisotropic etching or drilling is likewise through substrate 110, and then through a dielectric layer 524 for a stop on metal layer 523. Of course chemistries may be changed, including changed in situ, for such etching or drilling to account for etching or drilling different materials. Moreover, even though etching or drilling may be used exclusively, in another implementation a combination of drilling then etching, or vice versa, may be used to form channels 140.

With reference to FIG. 14, a BSI sensor 510 is coupled to a substrate 110, where IPDs 520 are formed from such substrate 110. As many of the components of image sensor devices 100 of FIGS. 7 and 14 are the same or similar, description of those components is generally not repeated below for purposes of clarity and not limitation.

Image processor die ("IPD") 520 may include IPD bond pads 541. IPD bond pads 541 may be coupled to either or both of an IPD metal layer 523 or a metal layer 111. An IPD oxide or other dielectric layer 524 may be formed on metal layer 111, and metal layer 111 may be coupled to IPD circuitry of IPD 520.

An IPD bond pad 541 may be coupled to or formed as part of metal layer 111. IPD bond pad 541 may be at least partially in IPD oxide layer 524. IPD bond pad 541 may be coupled for electrical conductivity with an IPD metal layer 523, and IPD metal layer 523 may be formed on IPD oxide layer 524. IPD oxide layer 513 may be deposited on IPD metal layer 523.

A BSI oxide layer 511 of BSI sensor 510 may be on an underside of BSI sensor 510. Bond pads 131 may be formed as previously described.

BSI sensor 510 may include a BSI metal layer 512 formed between BSI oxide layer 521 and BSI oxide layer 511. A BSI oxide layer 511 to carrier oxide layer 513 interface may be an oxide-to-oxide bond interface, such as previously described, for coupling BSI sensor 510 and substrate 110 to one another. Along those lines, this coupling may be done as a wafer-to-wafer coupling for subsequent dicing via dicing lanes 160.

Moreover, through substrate vias or TSVs 525 and 526 may be respectively interconnected to metal layers 512 and 523. Along those lines, TSVs 526 may go through a substrate of BSI sensor 510 from an upper surface thereof to a lower surface thereof, as well as through IPD oxide layer 513 to IPD metal layer 523. Accordingly, completion of TSVs 526 may be after coupling of BSI sensor 510 and substrate 110 to one another.

After coupling BSI sensor 510 and substrate 110 to one another, channels 140 may be etched or drilled using a stop on metal etch to reveal IPD bond pads 541, as well as bond pads 131. Wire bonds of wire bond wires 150 may then be made on bond pads 131 and 541 in channels 140, as previously described.

With reference to FIG. 15, a BSI sensor 510 is coupled to a substrate 110, where IPDs 520 are formed from such substrate 110. As many of the components of image sensor devices 100 of FIGS. 7, 14 and 15 are the same or similar, description of those components is generally not repeated below for purposes of clarity and not limitation.

IPD 520 may include IPD bond pads 541. IPD bond pads 541 may be coupled to either or both of an IPD metal layer 523 or a metal layer 111. An IPD oxide or other dielectric layer 524 may be formed on metal layer 111, and metal layer 111 may be coupled to IPD circuitry of IPD 520. IPD bond pad 541 may be coupled to or formed as part of metal layer 111. IPD bond pad 541 may be defined, at least in part, in IPD oxide layer 524. IPD bond pad 541 may be coupled for electrical conductivity with an IPD metal layer 523, and IPD metal layer 523 may be formed on IPD oxide layer 524. IPD oxide layer 513 may be deposited on IPD metal layer 523.

A BSI oxide layer 511 of BSI sensor 510 may be on an underside of BSI sensor 510. Bond pads 131 may be formed as previously described.

BSI sensor 510 may include a BSI metal layer 512 formed between BSI oxide layer 521 and BSI oxide layer 511. A BSI oxide layer 511 to carrier oxide layer 513 interface may be an oxide-to-oxide bond interface, such as previously described, for coupling BSI sensor 510 and substrate 110 to one another. Along those lines, this coupling may be done as a wafer-to-wafer coupling for subsequent dicing via dicing lanes 160.

Moreover, metal vias 527 may be respectively interconnected to metal layers 512 and 523. Along those lines, metal vias 527 may go through IPD oxide layer 513 to IPD metal layer 523 and go through BSI oxide layer 511 to BSI metal layer 512. Accordingly, a portion of metal vias 527 may be formed in BSI sensor 510 and another portion of metal vias 527 may be formed in IPD 520, and completion of metal vias 527 may be after coupling of BSI sensor 510 and substrate 110 to one another, which coupling may include a copper-to-copper bonding of corresponding metal via 527 portions to one another.

After coupling BSI sensor 510 and substrate 110 to one another, channels 140 may be etched or drilled using a stop on metal etch to reveal IPD bond pads 541, as well as bond pads 131. Wire bonds of wire bond wires 150 may then be made on bond pads 131 and 541 in channels 140, as previously described.

Figure 16:
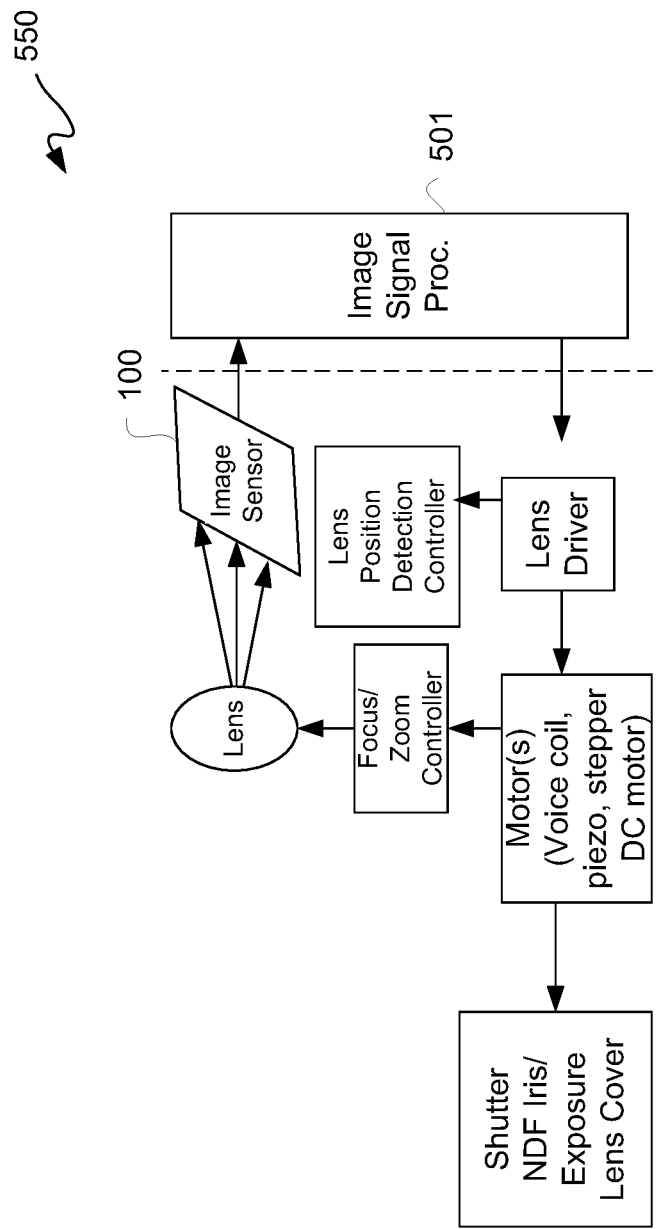
FIG. 16 is a block diagram illustratively depicting an exemplary camera system.

FIG. 16 is a block diagram illustratively depicting an exemplary camera system 550. In camera system 550, an image sensor device 100 is coupled to an image signal processor 501. Other details regarding camera system 550 are well-known, and thus not described for purposes of clarity and not limitation.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for forming an image sensor device, comprising:
   obtaining a substrate having an image sensor die;
   plating a conductive layer on a front side surface of the substrate;
   forming a through channel in the substrate from a back side surface to the front side surface of the substrate;
   bonding wire bond wires to conductive pads located in the channel;
   the wire bond wires extending in the channel away from the pads;
   tips of the wire bond wires being located outside of the channel;
   depositing a molding layer onto the back side surface of the substrate including into the channel; and
   forming a redistribution layer coupled to the wire bond wires for electrical conductivity.

2. The method according to claim 1, further comprising:
   adhering with an adhesive a cover to at least one of the conductive layer or the front side surface, the cover being offset from and over an optically-activatable portion of the image sensor die for defining a gap between an underneath side of the cover and the front side surface; and
   thinning the substrate prior to forming the through channel.

3. The method according to claim 1, wherein the forming of the through channel comprises drilling the substrate to reveal the conductive pads and stop on the conductive layer.

4. The method according to claim 1, wherein the substrate has the image sensor die and an image processor die coupled to one another.

5. The method according to claim 1, wherein the conductive pads are first bond pads obtained with the substrate, the method further comprising:
   grinding the molding layer and the tips to provide a planarized surface of the molding layer and upper ends of the wire bond wires; and forming second bond pads on the planarized surface for interconnection with the upper ends of the wire bond wires.

6. A method for forming an image sensor device, comprising:

obtaining a substrate having an image sensor die;

depositing a conductive layer on a front side surface of the substrate;

forming a through channel in the substrate from a back side surface to the front side surface of the substrate;

coupling an image controller die or an image processor die having interconnects to the back side surface of the substrate;

bonding wire bond wires to conductive pads located in the channel, the wire bond wires extending in the channel away from the pads with tips of the wire bond wires located outside of the channel and above or at least even with interconnects of the controller die;

depositing a molding layer onto the back side surface of the substrate including into the channel; and forming a redistribution layer coupled to the wire bond wires and the interconnects for electrical conductivity.

7. The method according to claim 6, further comprising:

adhering with an adhesive a cover to at least one of the conductive layer or the front side surface, the cover being offset from and over an optically-activatable portion of the image sensor die for defining a gap between an underneath side of the cover and the front side surface; and thinning the substrate for the coupling of the image controller die or the image processor die.

8. The method according to claim 7, wherein the thinning of the substrate comprises forming a die cavity for the coupling of the image controller die or the image processor die at least partially inside the die cavity.

9. The method according to claim 6, wherein the forming of the through channel comprises drilling the substrate to reveal the conductive pads and stop on the conductive layer.

10. The method according to claim 6, wherein the conductive pads are first bond pads obtained with the substrate, the method further comprising:

grinding the molding layer, the interconnects and the tips to provide a planarized surface of the molding layer and upper ends of the wire bond wires and the interconnects; and forming second bond pads on the planarized surface for interconnection with the upper ends of the wire bond wires and the interconnects.

* * * * *